US 10,719,928 B2

(12) United States Patent
Otaki et al.

(10) Patent No.: US 10,719,928 B2
(45) Date of Patent: Jul. 21, 2020

(54) PATTERN INSPECTION APPARATUS AND PATTERN INSPECTION METHOD

(71) Applicant: NuFlare Technology, Inc., Yokohama-shi (JP)

(72) Inventors: Toshiaki Otaki, Yokohama (JP); Riki Ogawa, Kawasaki (JP)

(73) Assignee: NuFlare Technology, Inc., Yokohama-shi (JP)

( * ) Notice: Subject to any disclaimer, the term of this patent is extended or adjusted under 35 U.S.C. 154(b) by 53 days.

(21) Appl. No.: 15/213,695

(22) Filed: Jul. 19, 2016

(65) Prior Publication Data
US 2017/0032507 A1 Feb. 2, 2017

(30) Foreign Application Priority Data

Jul. 31, 2015 (JP) ................................. 2015-151655

(51) Int. Cl.
*G06T 7/00* (2017.01)
*G01N 21/956* (2006.01)
(Continued)

(52) U.S. Cl.
CPC ........... *G06T 7/001* (2013.01); *G01N 21/956* (2013.01); *G02B 21/088* (2013.01);
(Continued)

(58) Field of Classification Search
CPC ..................................................... G06T 7/001
(Continued)

(56) References Cited

U.S. PATENT DOCUMENTS 6,088,537 A * 7/2000 Ohtaka ................ G02B 7/28
396/81
6,268,093 B1 7/2001 Kenan et al.
(Continued)

FOREIGN PATENT DOCUMENTS

JP   H09-222398    8/1997
JP   2001-159610 A  6/2001
(Continued)

OTHER PUBLICATIONS

Korean Office Action dated Sep. 15, 2017 in Patent Application No. 10-2016-0097335 (with English translation).
(Continued)

*Primary Examiner* — Jefferey F Harold
*Assistant Examiner* — Justin B Sanders
(74) *Attorney, Agent, or Firm* — Oblon, McClelland, Maier & Neustadt, L.L.P.

(57) ABSTRACT

A pattern inspection apparatus includes a transmitted illumination optical system to illuminate change the shape of a first inspection light, a reflected illumination optical system to illuminate a mask substrate with a second inspection light by using an objective lens and a polarizing element, and let a reflected light from the mask substrate pass therethrough, a drive mechanism to enable the polarizing element to be moved from/to outside/inside an optical path, a sensor to receive a transmitted light from the mask substrate illuminated with the first inspection light during stage moving, and an aperture stop, between the mask substrate and the sensor, to adjust a light flux diameter of the transmitted light so that the transmitted light reaching the sensor can be switched between high and low numerical aperture (NA) states with which the transmitted light from the mask substrate can enter the objective lens.

10 Claims, 10 Drawing Sheets

(51) Int. Cl.
    *G02B 21/24*      (2006.01)
    *G02B 21/36*      (2006.01)
    *G02B 21/08*      (2006.01)
    *G03F 1/84*      (2012.01)

(52) U.S. Cl.
    CPC ......... *G02B 21/245* (2013.01); *G02B 21/361* (2013.01); *G03F 1/84* (2013.01); *G06T 2207/30148* (2013.01)

(58) Field of Classification Search
    USPC .......................................................... 348/87
    See application file for complete search history.

(56) References Cited

U.S. PATENT DOCUMENTS

| | | |
|---|---|---|
| 6,466,315 B1 | 10/2002 | Karpol et al. |
| 7,133,548 B2 * | 11/2006 | Kenan ..................... G03F 7/701 |
| | | 382/144 |
| 8,760,642 B2 | 6/2014 | Hori et al. |
| 2001/0019625 A1 | 9/2001 | Kenan et al. |
| 2002/0005940 A1 * | 1/2002 | Hatada ................ G03F 7/70275 |
| | | 355/55 |
| 2012/0287424 A1 | 11/2012 | Hori et al. |
| 2015/0281557 A1 * | 10/2015 | Hirosawa ............. H04N 5/2258 |
| | | 348/208.12 |

FOREIGN PATENT DOCUMENTS

| | | | | |
|---|---|---|---|---|
| JP | 2001-235853 | | 8/2001 | |
| JP | 2008-286889 A | | 11/2008 | |
| JP | 2009-229230 | | 10/2009 | |
| JP | 2011-169743 | | 9/2011 | |
| JP | 2011169743 A | * | 9/2011 | .......... G01N 21/956 |
| JP | 2011169743 A | * | 9/2011 | |
| JP | 2012-237667 | | 12/2012 | |

OTHER PUBLICATIONS

Office Action dated May 7, 2019, in Japanese Patent Application No. 2015-151655, filed Jul. 31, 2015 w/Machine English Translation, citing documents AO, AP, AQ, and AR.

Office Acton dated Aug. 20, 2019, in Japanese Patent Application No. 2015-151655, filed Jul. 31, 2015, with English-language Translation.

* cited by examiner

PATTERN INSPECTION APPARATUS AND PATTERN INSPECTION METHOD

CROSS-REFERENCE TO RELATED APPLICATION

This application is based upon and claims the benefit of priority from the prior Japanese Patent Application No. 2015-151655 filed on Jul. 31, 2015 in Japan, the entire contents of which are incorporated herein by reference.

BACKGROUND OF THE INVENTION

Field of the Invention

Embodiments of the present invention relate generally to a pattern inspection apparatus and a pattern inspection method. More specifically, embodiments of the present invention relate, for example, to a pattern inspection technique for inspecting pattern defects of an object serving as a target workpiece or "sample" used in manufacturing semiconductor devices, and to an inspection apparatus for inspecting a photomask used in manufacturing semiconductor elements or liquid crystal displays (LCDs), and a method thereof.

Description of Related Art

In recent years, with the advance of high integration and large capacity of large-scale integration (LSI) circuits, the line width (critical dimension) required for circuits of semiconductor elements is becoming progressively narrower. Such semiconductor elements are manufactured by circuit formation of exposing and transferring a pattern onto a wafer by means of a reduced projection exposure apparatus known as a stepper while using an original or "master" pattern (also called a mask or a reticle, hereinafter generically referred to as a mask) with a circuit pattern formed thereon. Then, in fabricating a mask used for transfer printing such a fine circuit pattern onto a wafer, a pattern writing apparatus capable of writing or "drawing" fine circuit patterns by using electron beams needs to be employed. Pattern circuits may be written directly on the wafer by the pattern writing apparatus. Also, a laser beam writing apparatus that uses laser beams in place of electron beams for writing a pattern is under development.

Since LSI manufacturing requires a tremendous amount of manufacturing cost, it is crucial to improve its yield. However, as typified by a 1-gigabit DRAM (Dynamic Random Access Memory), the scale of a pattern configuring an LSI has changed from on the order of submicrons to nanometers. One of major factors that decrease the yield of the LSI manufacturing is due to pattern defects on the mask used, in the photolithography technology, for exposing and transfer printing an ultrafine pattern onto a semiconductor wafer. In recent years, with miniaturization of dimensions of LSI patterns formed on a semiconductor wafer, dimension to be detected as a pattern defect has become extremely small. Therefore, a pattern inspection apparatus for inspecting defects on a transfer mask used in manufacturing LSI needs to be highly accurate.

As an inspection method, there is known a method of comparing an optical image obtained by imaging a pattern formed on a target object or "sample" such as a lithography mask at a predetermined magnification by using a magnification optical system with design data or an optical image obtained by imaging an identical pattern on the target object. For example, the following is known as pattern inspection methods: the "die-to-die inspection" method that compares data of optical images of identical patterns at different positions on the same mask; and the "die-to-database inspection" method that inputs, into an inspection apparatus, writing data (design pattern data) generated by converting pattern-designed CAD data to a writing apparatus specific format to be input to the writing apparatus when a pattern is written on the mask, generates design image data (reference image) based on the input writing data, and compares the generated design image data with an optical image (serving as measurement data) obtained by imaging the pattern. In such inspection methods for use in the inspection apparatus, a target object is placed on the stage so that a light flux may scan the target object as the stage moves in order to perform an inspection. Specifically, the target object is irradiated with a light flux from the light source through the illumination optical system. Light transmitted through the target object or reflected therefrom forms an image on a sensor through the optical system. The image captured by the sensor is transmitted as measurement data to the comparison circuit. After performing position adjustment of images, the comparison circuit compares measurement data with reference data in accordance with an appropriate algorithm, and determines that there exists a pattern defect if the compared data are not identical.

Since the product cycle of semiconductor products is generally short, reducing the time required to manufacture them is an important point. If a mask pattern having a defect is exposed and transferred to a wafer, semiconductor devices made using the wafer become defective. Therefore, it is essential to inspect for pattern defects on the mask. Defects found in the inspection are corrected by a defect correction apparatus. However, correcting all the found defects results in increasing the required manufacturing time, thereby decreasing the product value. With the development of the inspection apparatus, it determines that there is a pattern defect even when a very small deviation occurs. However, when actually transfer-printing a mask pattern onto a wafer by an exposure apparatus, as long as no circuit disconnection and/or no short circuit occurs on the wafer due to such a pattern defect, the circuit can be used as an integrated circuit. Therefore, it is desired to use such a mask in order to perform exposure and transfer, with leaving the defective state without correcting such a defect each time. However, in the inspection apparatus, since the optical system is configured so that a minute deviation can be detected, the mask resolution is set to be higher than that of the exposure apparatus. Therefore, it is difficult for the inspection apparatus to reproduce a pattern image which is to be transfer printed by the exposure apparatus. Thus, it is difficult for the inspection apparatus to grasp how defects found by the inspection apparatus are to be exposed by the exposure apparatus.

Although there is disclosed a dedicated device which inspects an image to be exposed and transferred by an exposure apparatus (for example, refer to Japanese Patent Application Laid-open No. 2001-235853), the device cannot inspect an extremely small deviation. Therefore, it is difficult to inspect a minute deviation by using the device.

BRIEF SUMMARY OF THE INVENTION

According to one aspect of the present invention, a pattern inspection apparatus includes a stage configured to mount a mask substrate with a pattern formed thereon and to be movable, a transmitted illumination optical system configured to illuminate the mask substrate with a first inspection light, and to be able to change an illumination shape of the first inspection light, a reflected illumination optical system configured to include an objective lens and a polarizing element, illuminate the mask substrate with a second inspection light by using the objective lens and the polarizing element, and let a reflected light from the mask substrate pass through the reflected illumination optical system, a drive mechanism configured to enable the polarizing element to be moved from outside to inside an optical path, and from the inside to the outside the optical path, a sensor configured to receive a transmitted light from the mask substrate illuminated with the first inspection light while the stage is moving, an image forming optical system configured to receive the transmitted light through the objective lens, and focus a received transmitted light to form an image on the sensor, and an aperture stop placed between the mask substrate and the sensor, and configured to adjust a light flux diameter of the transmitted light so that the transmitted light reaching the sensor can be switched between a transmitted light corresponding to a state of high numerical aperture (NA) with which the transmitted light from the mask substrate can enter the objective lens and a transmitted light corresponding to a state of low numerical aperture with which the transmitted light from the mask substrate can enter the objective lens.

According to another aspect of the present invention, a pattern inspection method includes capturing one of a transmitted light image and a reflected light image of a pattern formed on a mask substrate by scanning the mask substrate by using a sensor in a state where the sensor can receive one of a transmitted light and a reflected light in a state of high numerical aperture of numerical aperture (NA) with which light from the mask substrate can enter an objective lens that magnifies one of the transmitted light and reflected light from the mask substrate with the pattern formed thereon, inspecting a defect of the pattern by using an optical image of one of a captured transmitted light image and a captured reflected light image of the pattern on the mask substrate, specifying a region where a defect has been detected as a result of the inspecting, switching the numerical aperture from the state of high numerical aperture to a state of low numerical aperture, capturing a transmitted light image of the pattern formed on the mask substrate by using the sensor by scanning the region of the mask substrate, which was specified using a predetermined illumination light, in a state where the sensor can receive light corresponding to the state of low numerical aperture, and where no polarizing element is located in an optical path between the mask substrate and the sensor, and comparing a simulation image and the transmitted light image of the pattern in the region, which was acquired as a result of receiving light corresponding to the state of low numerical aperture by the sensor, where the simulation image is based on an assumption that the pattern formed on the mask substrate is to be transferred to a semiconductor substrate by an exposure apparatus.

DETAILED DESCRIPTION OF THE INVENTION

First Embodiment

There will be described embodiments of an inspection apparatus and method, which inspects minute defects, capable of inspecting an image to be formed in the case where a pattern is exposed and transferred by an exposure apparatus.

Figure 1:
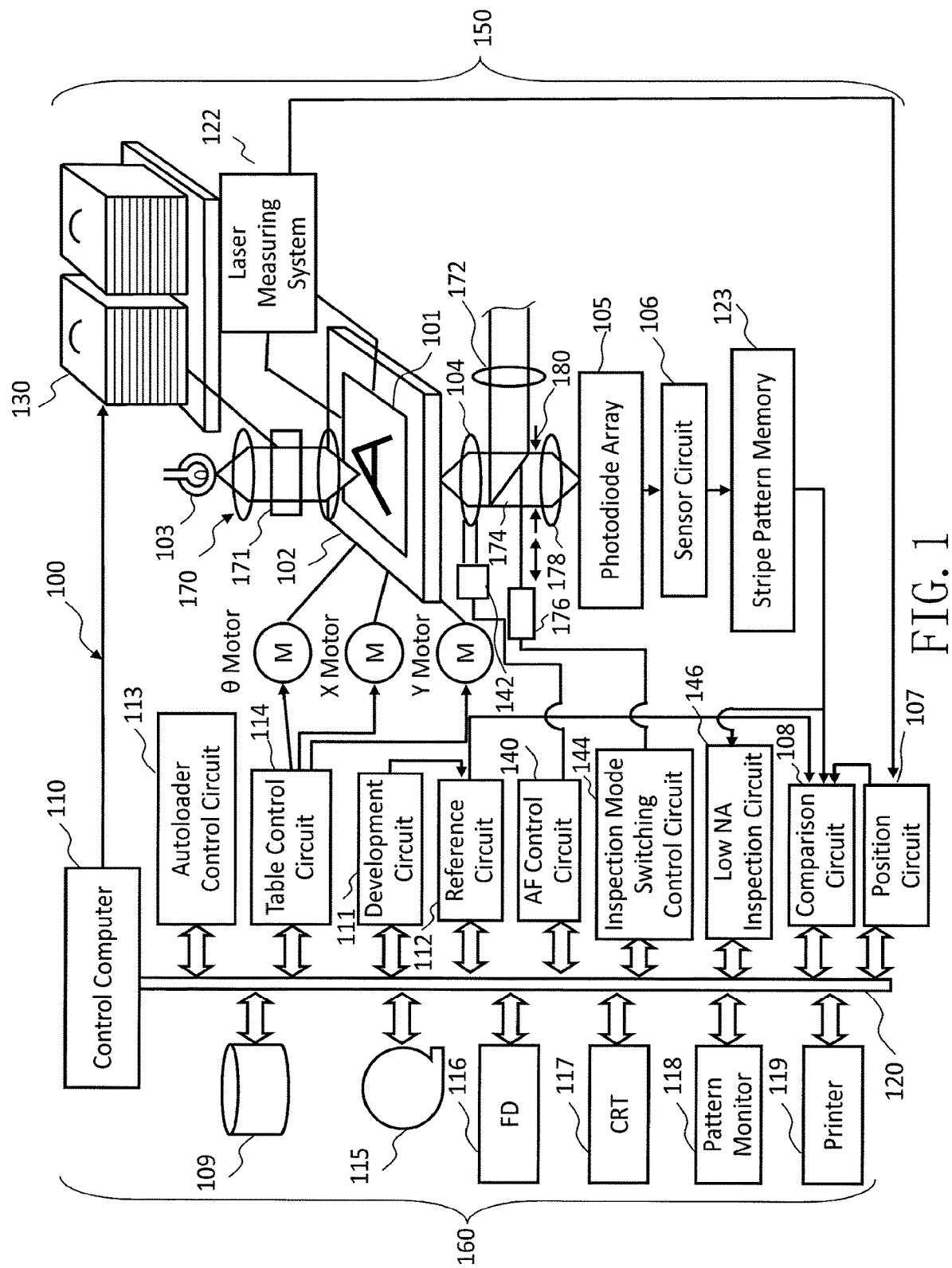
FIG. 1 illustrates a configuration of a pattern inspection apparatus according to a first embodiment.

FIG. 1 illustrates a configuration of a pattern inspection apparatus according to the first embodiment. As shown in FIG. 1, an inspection apparatus 100 that inspects defects of a pattern formed on a mask substrate 101 includes an optical image acquisition unit 150 and a control system circuit 160 (control unit).

The optical image acquisition unit 150 includes a light source 103, a transmitted illumination optical system 170, an illumination shape changing mechanism 171, an XYθ table 102 arranged movably, an objective lens 104, a reflected illumination optical system 172, an aperture stop 180, an image forming optical system 178, a photodiode array 105 (an example of a sensor), a sensor circuit 106, a stripe pattern memory 123, and a laser length measuring system 122. The mask substrate 101 is placed on the XYθ table 102. The mask substrate 101 is, for example, an exposure photomask used for transfer printing a pattern onto a wafer. A pattern composed of a plurality of figure patterns to be inspected is formed on the photomask. The mask substrate 101, for example, with its pattern forming surface facing downward, is placed on the XYθ table 102.

In the control system circuit 160, a control computer 110 is connected, through a bus 120, to a position circuit 107, a comparison circuit 108, a development circuit 111, a reference circuit 112, an autoloader control circuit 113, a table control circuit 114, an autofocus (AF) control circuit 140, an inspection mode switching control circuit 144, a low NA inspection circuit 146, a magnetic disk drive 109, a magnetic tape drive 115, a flexible disk drive (FD) 116, a CRT 117, a pattern monitor 118, and a printer 119. The sensor circuit 106 is connected to the stripe pattern memory 123 which is connected to the comparison circuit 108. The XYθ table 102 is driven by motors of X-, Y-, and θ-axis. The reflected illumination optical system 172 includes the objective lens 104 and a polarization beam splitter 174 (polarizing element). The polarization beam splitter 174 is moved from/to inside/outside the optical path by a drive mechanism 176.

In the inspection apparatus 100, an inspection optical system of large magnification is composed of the light source 103, the XYθ table 102, the transmitted illumination optical system 170, the objective lens 104, the photodiode array 105, and the sensor circuit 106. For example, an inspection optical system with 200 to 300-fold magnification is configured. The XYθ table 102 is driven by the table control circuit 114 under the control of the control computer 110. The XYθ table 102 can be moved by a drive system such as a three-axis (X, Y, and θ) motor, which drives the table in the directions of x, y, and θ. For example, a linear motor can be used as each of these X, Y, and θ motors. The xyθ table 102 is movable in the horizontal direction and the rotation direction by the motors of the X-, Y-, and θ-axis. The focus position (optical axis direction: Z axis direction) of the objective lens 104 is dynamically adjusted to be on the pattern forming surface of the mask substrate 101 by the AF control circuit 140 under the control of the control computer 110. For example, by moving the the objective lens 104 in the optical axis direction (Z-axis direction) by a piezoelectric element 142, the focus position of the objective lens 104 can be adjusted. The movement position of the mask substrate 101 placed on the XYθ table 102 is measured by the laser length measuring system 122, and supplied to the position circuit 107.

Design pattern data (writing data) used as the basis of pattern formation of the mask substrate 101 is input from outside the inspection apparatus 100 into the magnetic disk drive 109 to be stored therein.

FIG. 1 shows configuration elements necessary for describing the first embodiment. It should be understood that other configuration elements generally necessary for the inspection apparatus 100 may also be included therein.

Figure 2A:
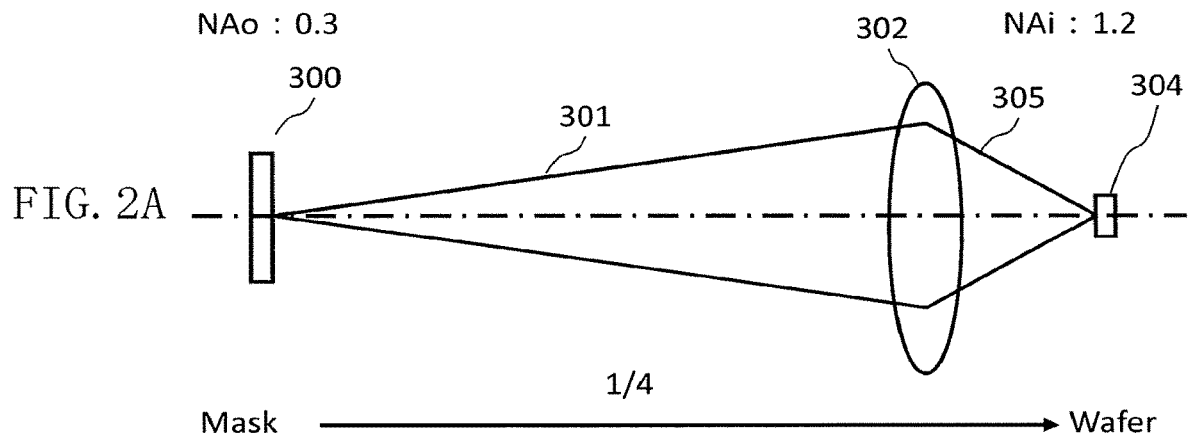
FIGS. 2A and 2B show comparison between numerical apertures of the inspection apparatus and the exposure apparatus according to the first embodiment.
Figure 2B:
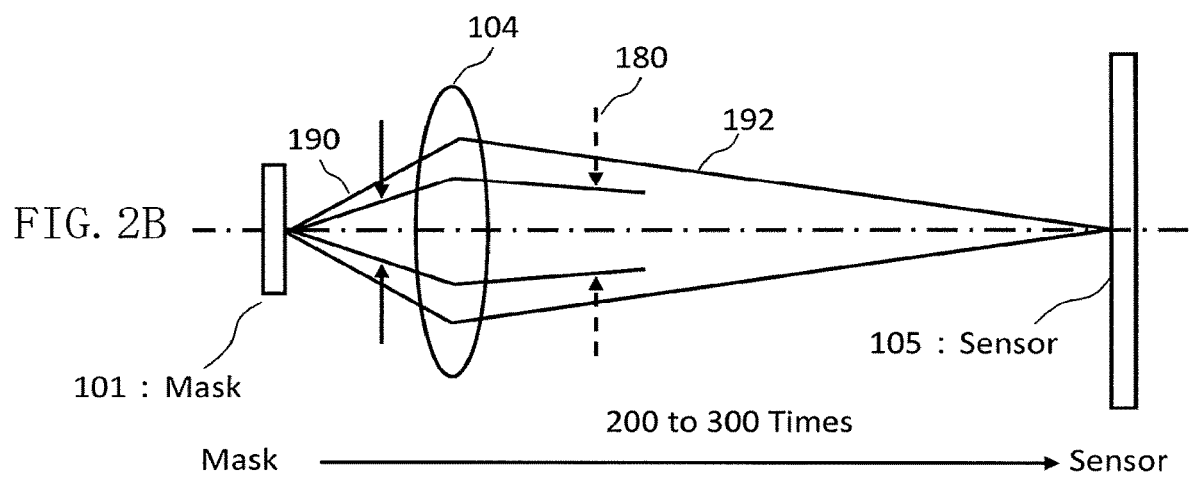

FIGS. 2A and 2B show comparison between numerical apertures of the inspection apparatus and the exposure apparatus according to the first embodiment. FIG. 2A shows a part of the optical system of the exposure apparatus. In the exposure apparatus, an illumination light (not shown) irradiates a mask substrate 300, a transmitted light 301 from the mask substrate 300 enters an objective lens 302, and a light 305 having passed through the objective lens 302 forms an image on a semiconductor substrate 304 (wafer). Although FIG. 2A shows the objective lens 302 composed of only one lens, it is, of course, also preferable to combine a plurality of lenses to configure the objective lens 302. In the currently-used exposure apparatus, a pattern formed on the mask substrate 300 is reduced to, for example, one-fourth to be exposed and transferred to the semiconductor substrate 304. In this regard, the numerical aperture NAi with respect to the semiconductor substrate 304 of the exposure apparatus is set to, for example, NAi=1.2. That is, the numerical aperture NAi (image "i" side numerical aperture) of the objective lens 302, which can pass through the objective lens 302, is set, for example, to NAi=1.2. Since a transmitted light image from the mask substrate 300 is reduced to one-fourth in the exposure apparatus, the sensitivity of the objective lens 302 to the mask substrate 300 becomes one-fourth. In other words, the numerical aperture NAo (object "o" side numerical aperture) of the objective lens 302, with which a transmitted light from the mask substrate 300 can enter the objective lens 302, is one-fourth of NAi, namely, NAo=0.3. Accordingly, it indicates that a transmitted light image of a light flux of numerical aperture NAo=0.3 from the mask substrate 300 is exposed and transferred to the semiconductor substrate 304 in the exposure apparatus.

On the other hand, in the inspection apparatus 100 according to the first embodiment, as shown in FIG. 2B, the mask substrate 101 is illuminated with an illumination light (not shown), a transmitted light 190 from the mask substrate 101 enters the objective lens 104, and a light 192 having passed through the objective lens 104 is focused to form an image on the photodiode array 105 (sensor). At this time, the numerical aperture NAo (object "o" side numerical aperture) of the objective lens 104, with which the transmitted light 190 from the mask substrate 101 can enter the objective lens 104, is set, for example, to NAo=0.9. In other words, it indicates that a transmitted light image of a light flux of numerical aperture NAo=0.9 from the mask substrate 101 is received by the photodiode array 105 in the inspection apparatus 100. Therefore, in the inspection apparatus 100, defect inspection is conducted using light with resolution higher than that of light to be exposed and transferred to the semiconductor substrate 304 by the exposure apparatus. By using such high resolution light, it becomes possible to conduct a high performance inspection capable of detecting minute defects such as nanometer-order ones. Although FIG. 2B shows only the objective lens 104, a plurality of lenses (not shown) are arranged between the objective lens 104 and the photodiode array 105.

However, as described above, in the inspection apparatus 100, since the photodiode array 105 receives light with resolution higher than that of light to be exposed and transferred to the semiconductor substrate 304 by the exposure apparatus, it is difficult for the inspection apparatus 100 to reproduce the same image as the pattern image to be formed on the semiconductor substrate 304 in the case where a pattern is exposed and transferred to the semiconductor substrate 304 by the exposure apparatus. Then, according to the first embodiment, the aperture stop 180 is arranged so that the light flux diameter of the transmitted light may be adjusted by narrowing the light flux from the mask substrate 101 in order to generate in the inspection apparatus 100 a light of the same numerical aperture NAo (object "o" side numerical aperture) (same resolution) as that of a light to be exposed and transferred to the semiconductor substrate 304 by the exposure apparatus.

Further, in the exposure apparatus, although a transmitted light from the mask substrate 300 is transfer printed onto the semiconductor substrate 304, a reflected light is not used. Therefore, a polarizing element is not arranged in the optical path from the mask substrate 300 to the semiconductor substrate 304. On the other hand, in the inspection apparatus 100, in addition to inspection using a transmitted light from the mask substrate 101, inspection using a reflected light from the mask substrate 101 can also be performed. Then, in addition to an inspection light (first inspection light or first illumination light) for transmitted light inspection, an inspection light (second inspection light or second illumination light) for reflected light inspection is needed. Therefore, in the inspection apparatus 100, the polarization beam splitter 174 (polarizing element) is arranged in the optical path which is for illuminating the mask substrate 300 with an inspection light for reflected light inspection. Then, the photodiode array 105 receives a light having passed through the polarization beam splitter 174 (polarizing element). Accordingly, the polarization component of light received by the photodiode array 105 in the inspection apparatus 100 differs from that of light for forming an image on the semiconductor substrate 304 in the case where a pattern is exposed and transferred to the semiconductor substrate 304 by the exposure apparatus. Also, in this regard, it is difficult for the inspection apparatus 100 to reproduce the same image as the pattern image to be formed on the semiconductor substrate 304 in the case where a pattern is exposed and transferred to the semiconductor substrate 304 by the exposure apparatus. Then, according to the first embodiment, it is configured such that the polarization beam splitter 174 (polarizing element) can be withdrawn (removed) from the optical path.

Moreover, the shape of the illumination light in the inspection apparatus 100 may be different from that in the exposure apparatus. Consequently, the illumination shape of the light received by the photodiode array 105 in the inspection apparatus 100 differs from that of the light to be focused to form an image on the semiconductor substrate 304 in the case where a pattern is exposed and transferred to the semiconductor substrate 304 by the exposure apparatus. Also, in this regard, it is difficult for the inspection apparatus 100 to reproduce the same image as the pattern image to be formed on the semiconductor substrate 304 in the case where a pattern is exposed and transferred to the semiconductor substrate 304 by the exposure apparatus. Then, according to the first embodiment, it is configured such that the illumination shape can be changed.

When the inspection apparatus 100 performs generating a light of the same numerical aperture NAo (object "o" side numerical aperture) (same resolution) as that of a light for exposure and transfer to the semiconductor substrate 304 in the exposure apparatus, withdrawing (removing) the polarization beam splitter 174 (polarizing element) from the optical path, and changing the illumination shape to be the same as that used in the exposure apparatus, it becomes possible for the inspection apparatus 100 to reproduce the same image as the pattern image to be formed on the semiconductor substrate, etc. in the case where a pattern on the mask substrate is exposed and transferred to the semiconductor substrate by the exposure apparatus. Therefore, according to the first embodiment, it is configured to switch between a high NA inspection mode for usual defect inspection, and a low NA inspection mode for inspection by reproducing the same image as the pattern image to be formed on the semiconductor substrate 304 in the case where a pattern is exposed and transferred to the semiconductor substrate 304 by the exposure apparatus.

Figure 3:
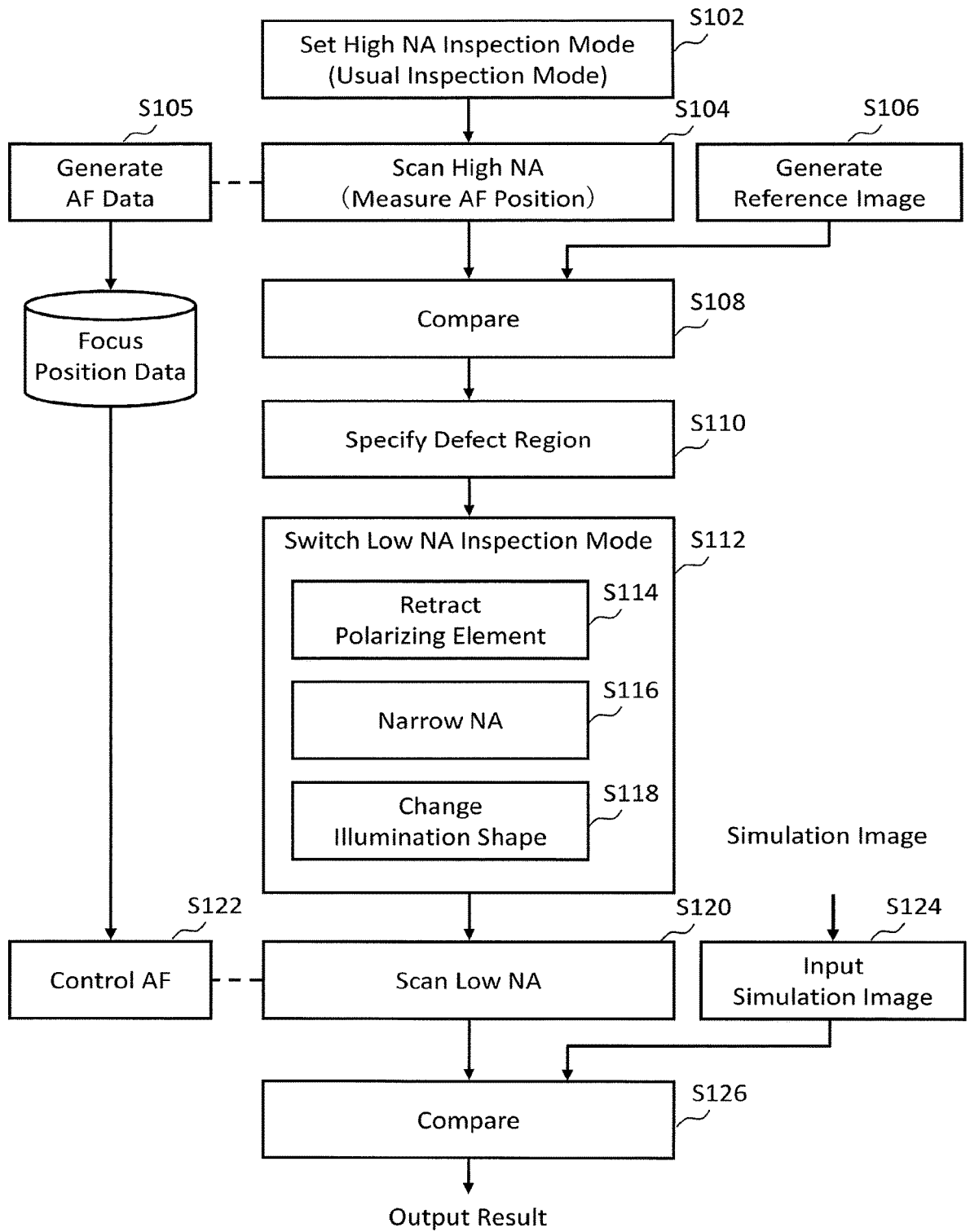
FIG. 3 is a flowchart showing main steps of an inspection method according to the first embodiment.

FIG. 3 is a flowchart showing main steps of an inspection method according to the first embodiment. As shown in FIG. 3, the inspection method of the first embodiment executes a series of steps: a high NA inspection mode setting step (S102), a high NA scanning step (S104), an autofocus (AF) data generating step (S105), a reference image generating step (S106), a comparison step (S108), a defect region specifying step (S110), a low NA inspection mode switching step (S112), a low NA scanning step (S120), an AF control step (S122), a simulation image input step (S124), and a comparison step (S126).

Moreover, the low NA inspection mode switching step (S112) executes, as internal steps, a polarizing element withdrawing step (S114), an NA narrowing step (S116), and an illumination shape change step (S118).

In the high NA inspection mode setting step (S102), the inspection mode switching control circuit 144 sets each configuration to be in the high NA inspection mode for performing usual high NA defect inspection. Specifically, it operates as described below. Receiving a control signal from the inspection mode switching control circuit 144, the illumination shape changing mechanism 171 sets the shape of illumination light (inspection light) to be the illumination shape for usual inspection. The inspection mode switching control circuit 144 controls the aperture value of the aperture stop 180 such that the numerical aperture NAo (object "o" side numerical aperture) with which the transmitted light 190 from the mask substrate 101 can enter the objective lens 104 is NAo=0.9, for example. The inspection mode switching control circuit 144 controls the drive mechanism 176 so that the polarization beam splitter 174 may be arranged in the optical path. If the polarization beam splitter 174 is located outside the optical path, it is moved into the optical path. If the polarization beam splitter 174 is located in the optical path, the position should be maintained.

In the high NA scanning step (S104), a transmitted light image or a reflected light image of a pattern formed on the mask substrate 101 is imaged by scanning the mask substrate 101 by using the photodiode array 105 (sensor) in the state where the photodiode array 105 can receive the transmitted light or the reflected light of a high NA state of the numerical aperture (NA) with which light from the mask substrate 101 can enter the objective lens 104 that magnifies the transmitted light or reflected light from the mask substrate 101 with the pattern formed thereon. Specifically, it operates as described below.

Figure 4:
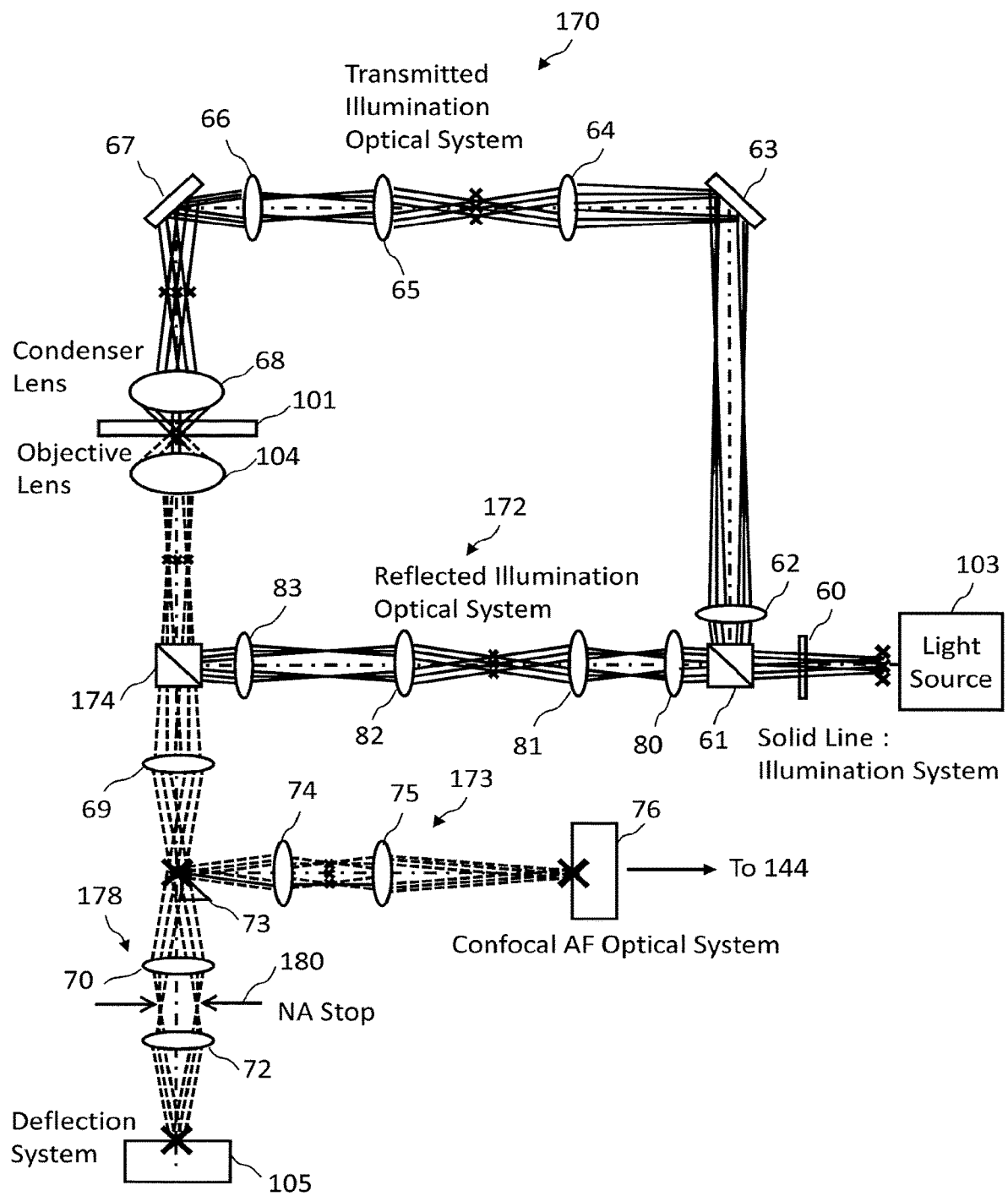
FIG. 4 shows an example of the structure of an optical system in high NA inspection mode according to the first embodiment.

FIG. 4 shows an example of the structure of an optical system in high NA inspection mode according to the first embodiment. In FIG. 4, there is generated a laser beam (e.g., a DUV light) from the light source 103, which is used as an inspection light and whose wavelength is shorter than or equal to that of the ultraviolet region. The generated light is polarized by a polarizing plate 60. In the case of performing a transmitted light inspection, illumination light for transmission inspection (one of p and s waves) is made to pass through the polarizing plate 60. Then, the illumination light for transmission inspection (one of p and s waves) is reflected by a polarization beam splitter 61. On the other hand, in the case of performing a reflected light inspection, illumination light for reflection inspection (the other one of p and s waves) is made to pass through the polarizing plate 60. Then, the illumination light for reflection inspection (the other one of p and s waves) passes through the polarization beam splitter 61. For example, the light to pass can be limited by rotating the polarizing plate 60. By this, it is possible to perform selection between the transmitted light inspection and the reflected light inspection.

When conducting a transmitted light inspection, illumination light for transmission inspection (first inspection light) is illuminated onto the mask substrate 101 by the transmitted illumination optical system 170. With reference to the example of FIG. 4, a specific example is described. In the transmitted illumination optical system 170, an illumination light for transmission inspection, which was branched by the polarization beam splitter 61, is reflected by a mirror 63, passes through lenses 64, 65, and 66, and is reflected by a mirror 67. Then, the light reflected by the mirror 67 is focused, from the back side opposite to the pattern forming surface of the mask substrate 101, to form an image on the pattern forming surface of the mask substrate 101 by a condenser lens 68. The transmitted light having passed through the mask substrate 101 enters the image forming optical system 178 through the objective lens 104 and the polarization beam splitter 174. In the image forming optical system 178, the light having passed the polarization beam splitter 174 passes through lenses 69 and 70, and after passing through the aperture stop 180, focuses to form an image on the photodiode array 105 (an example of a sensor) by a lens 72. Thus, the transmitted light enters the photodiode array 105 by the image forming optical system 178, and an optical image is formed on the photodiode array 105. It is preferable to use, for example, a TDI (time delay integration) sensor, etc. as the photodiode array 105. The photodiode array 105 (sensor) takes an optical image of a pattern formed on the mask substrate 101 in the state where the XYθ table 102 with the mask substrate 101 thereon is moving.

On the other hand, when conducting a reflected light inspection, illumination light for reflection inspection (second inspection light) is illuminated onto the mask substrate 101 by the reflected illumination optical system 172. The reflected illumination optical system 172 includes the objective lens 104 and the polarization beam splitter 174 (polarizing element). In the reflected illumination optical system 172, an illumination light for reflection inspection is illuminated onto the mask substrate 101 by using the objective lens 104 and the polarization beam splitter 174, and a reflected light from the mask substrate 101 is made to pass through the reflected illumination optical system 172. With reference to the example of FIG. 4, a specific example is described. In the reflected illumination optical system 172, the illumination light for reflection inspection, having passed through the polarization beam splitter 61, passes through lenses 80, 81, 82, and 83, and is reflected by the polarization beam splitter 174. The light reflected by the polarization beam splitter 174 enters the objective lens 104, and focuses, from the pattern forming surface side of the mask substrate 101, to form an image on the pattern forming surface of the mask substrate 101 by the objective lens 104. The reflected light reflected from the mask substrate 101 passes through the objective lens 104 and the polarization beam splitter 174, and enters the image forming optical system 178. In the image forming optical system 178, the light is focused to form an image on the photodiode array 105 (an example of a sensor), and the formed image enters the photodiode array 105, as an optical image. The photodiode array 105 (sensor) takes an optical image of a pattern formed on the mask substrate 101 in the state where the XYθ table 102 with the mask substrate 101 thereon is moving.

At this time, a part of the reflected light is branched by a mirror 73 arranged between the lenses 69 and 70, and a branched light is focused to form an image on an AF sensor 76 by an AF optical system 173. The light receiving surface of the AF sensor 76 is disposed to be in a confocal relation with that of the photodiode array 105, with respect to the beam splitter 73. An output signal from the AF sensor 76 is transmitted to the AF control circuit 140. When the photodiode array 105 receives a reflected light with a high numerical aperture, the AF control circuit 140 measures the focus position of each position on the mask substrate 101 by using the reflected light. Based on the output signal described above, the AF control circuit 140 dynamically adjusts the focus position (optical axis direction: Z axis direction) of the objective lens 104 to be on the pattern forming surface of the mask substrate 101 by moving the objective lens 104 in the optical axis direction (Z axis direction) in real time by way of controlling the piezoelectric element 142. Even when conducting a transmitted light inspection, a part of illumination light for the reflection inspection is sent, for AF, to the mask substrate 101 by the reflected illumination optical system 172. Then, a reflected light corresponding to the part of the illumination light is reflected, by the mirror 73, to form an image on the AF sensor 76. Thereby, even when performing only transmitted light inspection without performing reflection inspection, the focus position (optical axis direction: Z axis direction) of the objective lens 104 can be dynamically adjusted to be on the pattern forming surface of the mask substrate 101.

In the inspection apparatus 100, it is possible to perform one or both of transmitted light scanning and reflected light scanning. A reflected light reflected from the mask substrate 101 includes pattern height information which is difficult to obtain from a transmitted light from the mask substrate 101. Therefore, the AF control circuit 140 carries out AF control by not using a transmitted light from the mask substrate 101 but by using a reflected light from the mask substrate 101. When conducting both the transmitted light scanning and the reflected light scanning, whichever may be performed first.

Figure 5:
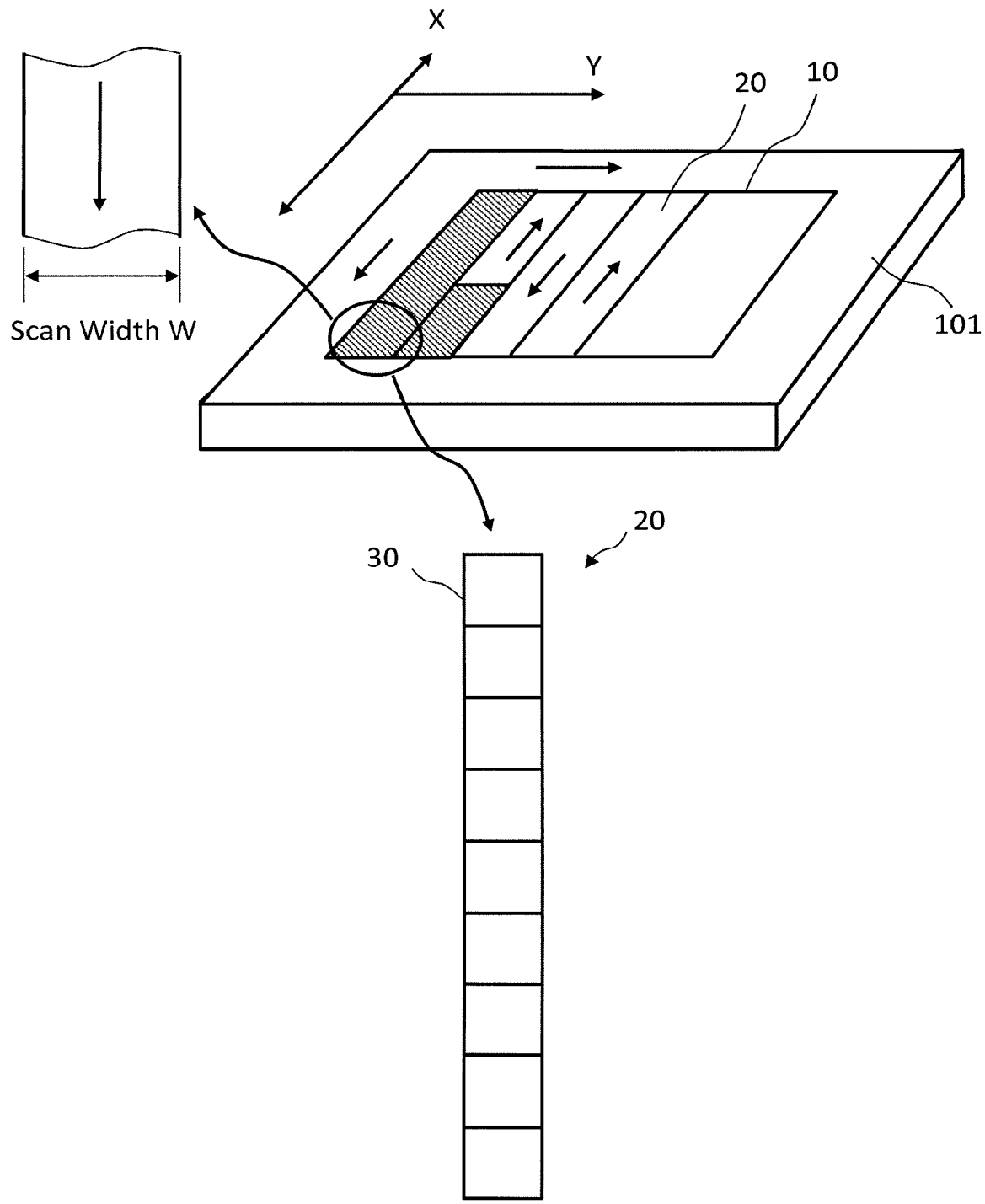
FIG. 5 is a conceptual diagram illustrating an inspection region according to the first embodiment.

FIG. 5 is a conceptual diagram illustrating an inspection region according to the first embodiment. As shown in FIG. 5, an inspection region 10 (entire inspection region) of the mask substrate 101 is virtually divided into a plurality of strip-shaped inspection stripes 20 each having a scan width W in the y direction, for example. In the inspection apparatus 100, an image (strip region image) is acquired for each inspection stripe 20. That is, with respect to each of the inspection stripes 20, an image of a figure pattern arranged in the stripe region concerned is captured in the longitudinal direction (the x direction) of the stripe region concerned by using a laser light. Optical images are acquired by the photodiode array 105 which moves relatively in the x direction continuously because a Zθ stage 70 moves in the x direction by the movement of an x stage 74 in the XYθ table 120. The photodiode array 105 continuously captures optical images each having a scan width W as shown in FIG. 5. In other words, the photodiode array 105, being an example of a sensor, captures optical images of patterns formed on the mask substrate 101 by using an inspection light while moving relatively to the XYθ table 102. According to the first embodiment, after capturing an optical image in one inspection stripe 20, the photodiode array 105 moves in the y direction to the position of the next inspection stripe 20 and similarly captures another optical image having a scan width W continuously while moving in the direction reverse to the last image capturing direction. Thereby, the image capturing is repeated in the forward(FWD) to backward(BWD) direction, namely changing the direction reversely in advancing and returning.

The direction of the image capturing is not limited to repeating the forward(FWD) and backward(BWD) movement. It is also acceptable to capture an image from a fixed one direction. For example, repeating FWD and FWD may be sufficient, and alternatively, BWD and BWD may also be sufficient.

A pattern image focused/formed on the photodiode array 105 is photoelectrically converted by each light receiving element of the photodiode array 105, and further analog-to-digital (A/D) converted by the sensor circuit 106. Then, pixel data for the inspection stripe 20 to be measured is stored in the stripe pattern memory 123. When imaging the pixel data (stripe region image), a dynamic range where the maximum gray level is 60% incidence of the illumination light quantity, for example, is used as the dynamic range of the photodiode array 105. When acquiring an optical image of the inspection stripe 20, the laser length measuring system 122 measures the position of the XYθ table 102. The measured position information is output to the position circuit 107. The position circuit 107 (calculation unit) calculates the position of the mask substrate 101 by using the measured position information.

Then, the stripe region image is sent to the comparison circuit 108 with data indicating the position of the mask substrate 101 on the XYθ table 102 output from the position circuit 107. Measurement data (pixel data) is 8-bit unsigned data, for example, and indicates a gray level (light intensity)

of brightness of each pixel. The stripe region image having been output to the comparison circuit 108 is stored in the storage device (not shown).

In the comparison circuit 108, a stripe region image is divided into images by a predetermined size (for example, by the same width as the scan width W) in the x direction so that a frame image of a target frame region 30 may be clipped from the stripe region image (optical image) of the inspection stripe 20. For example, it is divided into frame images each having 512×512 pixels. In other words, the stripe region image of each inspection stripe 20 is divided into a plurality of frame images (optical images) by the width being the same as that of the inspection stripe 20, for example, by the scan width W. By this processing, a plurality of frame images (optical images) corresponding to a plurality of frame regions 30 can be acquired. With respect to a plurality of frame images, as described above, data of one image (measured image) being one side to be compared for inspection is generated.

In the autofocus (AF) data generating step (S105), when conducting reflected light scanning or transmitted light scanning described above, simultaneously, the AF control circuit 140 stores focus position information depending on the height position of the surface of the mask substrate 101 used for AF control, in the magnetic disk drive 109. Therefore, the magnetic disk drive 109 (storage device) stores focus position information of each position on the mask substrate 101, which was measured using a reflected light from the mask substrate 101 irradiated with a light through the reflected illumination optical system 172 in the state where the polarization beam splitter 174 (polarizing element) has been moved into the optical path.

In the high NA scan step (S104) described above, in the case of performing only the transmitted light scanning, what is necessary is to have acquired focus position information depending on the height position of the surface of the mask substrate 101 beforehand using a reflected light. When performing transmitted light scanning in the high NA scan step (S104), the focus position information acquired at this time is used for AF control.

In the reference image generating step (S106), first, the development circuit 111 (an example of a reference image generating unit) generates a design image by performing image development based on design pattern data used as the basis of pattern formation of the mask substrate 101. Specifically, the development circuit 111 reads design data from the magnetic disk drive 109 through the control computer 110. Each figure pattern in the region of a target frame 30 defined in the design data having been read is converted (image development) into image data of binary values or multiple values.

Basics of figures defined in design pattern data are, for example, rectangles or triangles. For example, figure data (vector data) that defines the shape, size, position, and the like of each pattern figure is stored as information, such as coordinates (x, y) of the reference position of a figure, the length of a side, the figure code being an identifier for identifying a figure type, such as a rectangle or a triangle.

When information on design pattern used as figure data is input to the development circuit 111, the data is developed into data of each figure. Then, a figure code, figure dimensions and the like indicating the figure shape of the figure data are interpreted. Design image data of binary values or multiple values is developed and output as a pattern to be arranged in a grid which is a unit of a predetermined quantization size grid. In other words, design data is loaded, and an occupancy rate of a figure in a design pattern is calculated for each grid obtained by virtually dividing an inspection region into grids of predetermined dimensions. Then, occupancy rate data of n bits is output. For example, it is preferable that one grid is set as one pixel. If one pixel has the resolution of $1/2^8$ (=1/256), a small region of 1/256 is allocated to the region of a figure arranged in a pixel to calculate the occupancy rate in the pixel. Then, a design image where occupancy rate data is 8 bits is generated for each pixel. The data of the design image is output to the reference circuit 112.

The reference circuit 112 (an example of a reference image generating unit) performs filter processing on the design image in order to generate a reference image.

Figure 6:
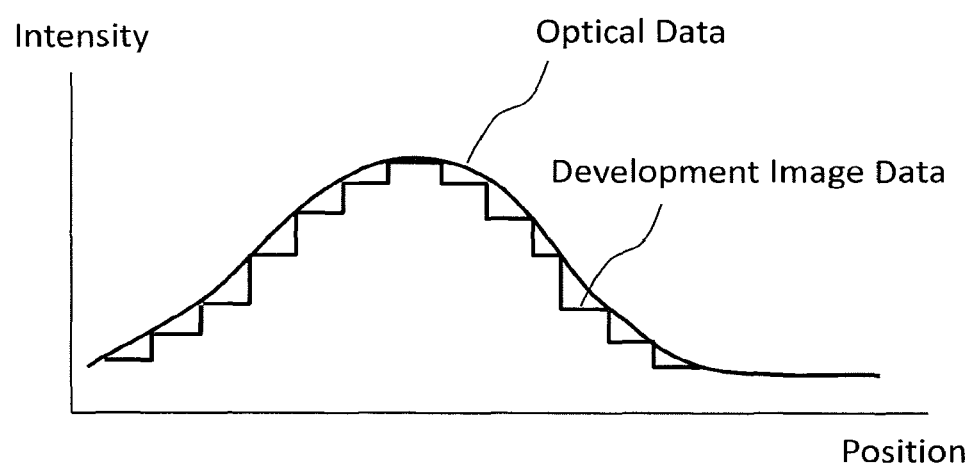
FIG. 6 shows filter processing according to the first embodiment.

FIG. 6 shows filter processing according to the first embodiment. Since the measurement data being an optical image obtained from the sensor circuit 106 is in a state affected by the filtering due to resolution characteristics of the objective lens 104, an aperture effect of the photodiode array 105, and/or the like, in other words, in the analog state continuously changing, it is possible to be matched with the measurement data by also performing filter processing on reference design image data being image data of the design side whose image intensity (gray value) is represented by a digital value. In this way, a reference image is generated to be compared with a frame image (optical image). The generated reference image is output to the comparison circuit 108 to be stored in a storage device (not shown). As described above, data of image (reference image) being the other side to be compared for inspection is generated.

In the comparison step (S108), the comparison circuit 108 inspects defects of a pattern by using an optical image of a transmitted light image or a reflected light image of a pattern of the captured mask substrate 101. The comparison circuit 101 (comparison unit) compares a frame image (optical image) with a reference image for each pixel. Specifically, with respect to a comparison target frame image (optical image) and a comparison target reference image, position alignment is first performed based on a predetermined algorithm. For example, the position alignment is performed using a least-squares method. The comparison circuit 108 compares a frame image and a reference image for each pixel, based on predetermined determination conditions in order to determine whether there is a defect, such as a shape defect. As the determination conditions, for example, a predetermined algorithm is used, based on which a frame image and its corresponding reference image are compared with each other for each pixel in order to determine whether a defect exists or not. For example, it is determined whether the difference between pixel values of both the images is larger than a determination threshold, and if larger, it is determined that there is a defect. Then, the comparison result is output, and specifically should be output to the magnetic disk drive 109, magnetic tape drive 115, flexible disk drive (FD) 116, CRT 117, or pattern monitor 118, or alternatively, output from the printer 119.

Figure 7:
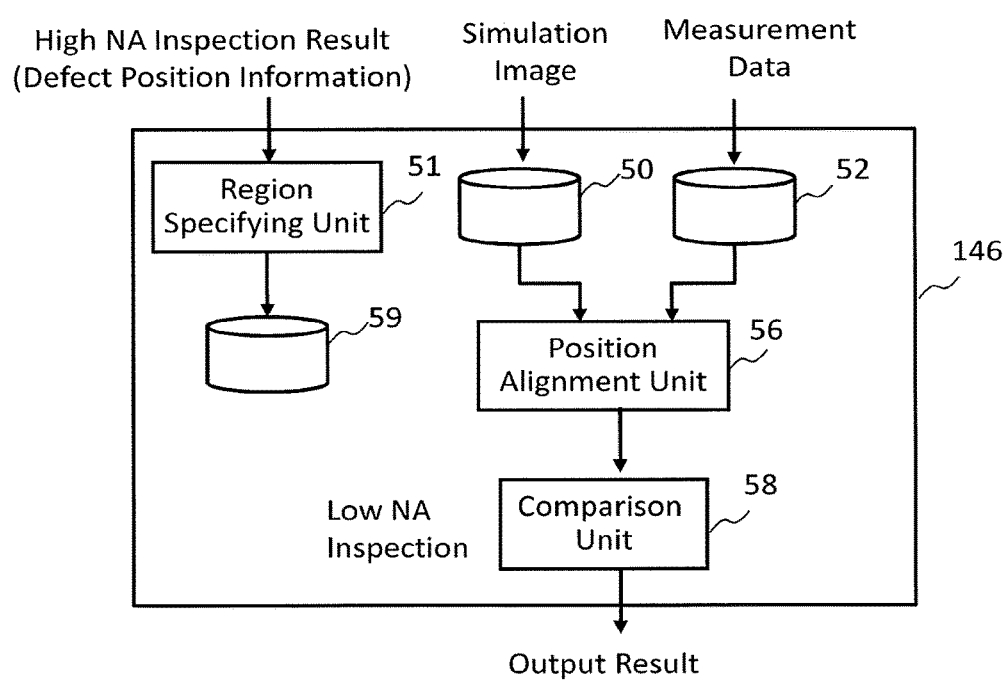
FIG. 7 is a block diagram showing the internal structure of a low NA inspection circuit according to the first embodiment.

FIG. 7 is a block diagram showing the internal structure of a low NA inspection circuit according to the first embodiment. As shown in FIG. 7, storage devices 50, 52, and 59, such as magnetic disk drives, a region specifying unit 51, a position alignment unit 56, and a comparison unit 58 are arranged in the low NA inspection circuit 146.

In the defect region specifying step (S110), the region specifying unit 51 inputs information (e.g., coordinate information on a defect position) on an inspection result from the comparison circuit 108, and specifies the region where a defect was detected, which is hereinafter called a defect region, based on the inspection result information. A frame region 30 including a defect position can be an example of the defect region. However, it is not limited thereto, and the size of the defect region can be variously selected. Information on a specified defect region is stored in the storage device 59.

In the low NA inspection mode switching step (S112), the inspection mode switching control circuit 144 switches setting of each configuration from the high NA inspection mode described above to the low NA inspection mode for performing low NA defect inspection. Thereby, the photodiode array 105 can receive the same or substantially the same image as the pattern image to be formed on the semiconductor substrate 304 in the case where a pattern is exposed and transferred to the semiconductor substrate 304 by the exposure apparatus. The internal steps are performed as described below.

In the polarizing element withdrawing step (S114), the inspection mode switching control circuit 144 moves the polarization beam splitter 174 on the optical path to be outside the optical path by controlling the drive mechanism 176. Thus, the drive mechanism 176 can move a polarizing element from outside to inside the optical path, and can also move it from inside to outside the optical path. Since a reflected light is no longer used due to withdrawal of the polarization beam splitter 174, the inspection mode switching control circuit 144 rotates the polarizing plate 60 so that only the illumination light for transmission inspection (one of p and waves) may pass therethrough.

In the NA narrowing step (S116), the inspection mode switching control circuit 144 switches the numerical aperture NA from the high NA state to the low NA state. Specifically, it is controlled such that the numerical aperture NAo (object "o" side numerical aperture), with which the transmitted light 190 from the mask substrate 101 can enter the objective lens 104, has the same characteristics as those of the exposure apparatus. For example, the aperture value of the aperture stop 180 is controlled to be NAo=0.3. According to the first embodiment, since it is switched to the low NA state from the high NA state, the opening of the aperture stop 180 is made smaller. Thus, the aperture stop 180 adjusts the light flux diameter of a transmitted light or/and a reflected light so that the transmitted light or/and the reflected light reaching the photodiode array 105 (sensor) can be switched between transmitted light or/and reflected light corresponding to a state of high numerical aperture (NA) with which the transmitted light from the mask substrate 101 can enter the objective lens 104 and transmitted light or/and reflected light corresponding to a state of low numerical aperture with which the transmitted light from the mask substrate 101 can enter the objective lens 104. Although, in the example of FIG. 4, the aperture stop 180 is arranged between the lenses 70 and 72 in the image forming optical system 178, it is not limited thereto. It is sufficient as long as the light flux diameter can be adjusted by narrowing the flux of light incident to the objective lens 104, or light incident to the photodiode array 105 through the objective lens 104. Therefore, the aperture stop 180 should be arranged between the mask substrate 101 and the photodiode array 105. More preferably, the aperture stop 180 should be arranged at the pupil position.

In the illumination shape change step (S118), receiving a control signal from the inspection mode switching control circuit 144, the illumination shape changing mechanism 171 changes the shape of an illumination light (inspection light) to be the same illumination shape as that used in the exposure apparatus.

In the low NA scanning step (S120), a transmitted light image of a pattern formed on the mask substrate 101 is captured using the photodiode array 105 by scanning the defect region of the mask substrate 101, which was specified using a predetermined illumination light, in the state where the photodiode array 105 can receive a light corresponding to the low NA state, and in the state where no polarizing element is located in the optical path between the mask substrate 101 and the photodiode array 105. Specifically, it operates as described below.

Figure 8:
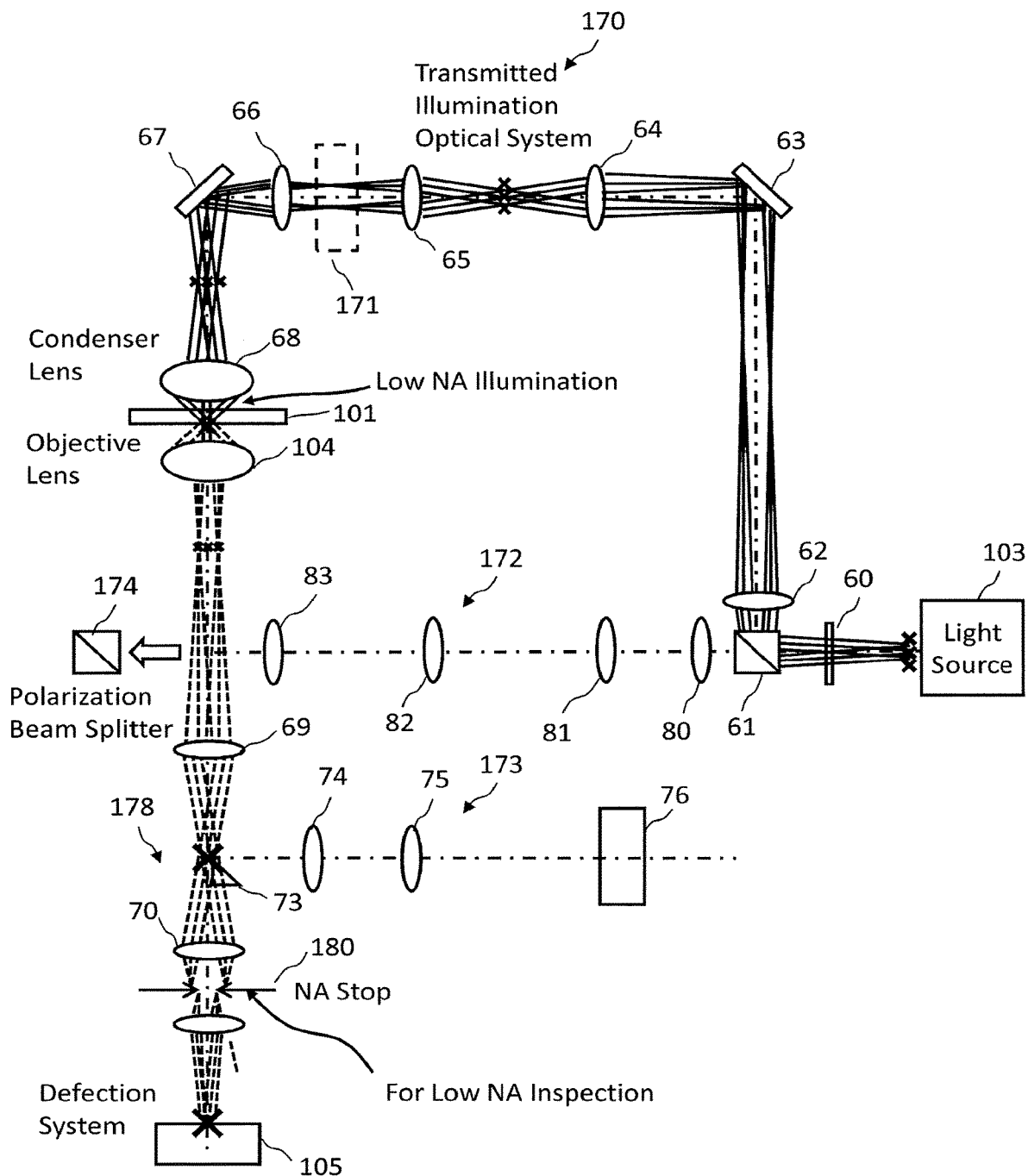
FIG. 8 shows an example of the structure of an optical system in low NA inspection mode according to the first embodiment.

FIG. 8 shows an example of the structure of an optical system in low NA inspection mode according to the first embodiment. In FIG. 8, light generated from the light source 103 is polarized through the polarizing plate 60, and only the illumination light for transmission inspection (one of p and s waves) is made to pass. Then, the illumination light for transmission inspection (one of p and s waves) is reflected by the polarization beam splitter 61. The illumination light for transmission inspection (first inspection light) is illuminated onto the mask substrate 101 by the transmitted illumination optical system 170. On this occasion, the illumination shape changing mechanism 171 changes the structure of the transmitted illumination optical system 170 in order to change the illumination shape of the illumination light for transmission inspection (first inspection light). Thus, the transmitted illumination optical system 170 is configured such that the illumination shape of illumination light for transmission inspection (first inspection light) can be changed. In the example of FIG. 8, after the illumination light for transmission inspection, which was reflected by the polarization beam splitter 61, has reached the lens 65, the illumination shape is changed between the lenses 65 and 66. The illumination light for transmission inspection whose illumination shape has been changed is reflected by the mirror 67. Then, the light reflected by the mirror 67 is focused, from the back side opposite to the pattern forming surface of the mask substrate 101, to form an image on the pattern forming surface of the mask substrate 101 by the condenser lens 68. Thereby, it becomes possible to irradiate the mask substrate 101 with a light having the same illumination shape as that used in the exposure apparatus. The transmitted light having passed through the mask substrate 101 enters the image forming optical system 178 through the objective lens 104. Then, by the image forming optical system 178, an image is formed on the photodiode array 105 (an example of a sensor) and enters the photodiode array 105, as an optical image. At this time, since the numerical aperture has been restricted by the aperture stop 180, an optical image of the light corresponding to low NA enters the photodiode array 105. In other words, a light flux of the transmitted light, corresponding to the state of low numerical aperture of numerical aperture (NA) in the transmitted light from the mask substrate 101 which enters the objective lens 104, is made to reach the photodiode array 105 (the sensor) when the light flux diameter of the transmitted light passing through the optical path of the image forming optical system 178 is narrowed. In the example of FIG. 8, the light having passed through the objective lens 104 passes through lenses 69 and 70, and the aperture stop 180, and is focused to form an image on the photodiode array 105 by the lens 72 in the image forming optical system 178. Thus, while the XYθ table 102 is moving, the photodiode array 105 receives transmitted light from the mask substrate 101 which is illuminated with the illumination light for transmission inspection (first inspection light).

On the other hand, as shown in FIG. 8, since the illumination light for reflection inspection is blocked by the polarizing plate 60, it does not enter the reflected illumination optical system 172. Even when the illumination light for reflection inspection enters the reflected illumination optical system 172, since the polarization beam splitter 174 (polarizing element) has been withdrawn (removed) from the optical path in the reflected illumination optical system 172, the illumination light for reflection inspection does not illuminate the mask substrate 101.

According to what is described above, the photodiode array 105 can receive the same or substantially the same image as the pattern image to be formed on the semiconductor substrate 304 in the case where a pattern is exposed and transferred to the semiconductor substrate 304 by the exposure apparatus.

The pattern image focused/formed on the photodiode array 105 is photoelectrically converted by each light receiving element of the photodiode array 105, and further analog-to-digital (A/D) converted by the sensor circuit 106. Then, pixel data for a defect region to be measured is stored in the stripe pattern memory 123. When imaging the pixel data (defect region image), a dynamic range where the maximum gray level is 60% incidence of the illumination light quantity, for example, is used as the dynamic range of the photodiode array 105. When acquiring an optical image of the defect region, the laser length measuring system 122 measures the position of the XYθ table 102. The measured position information is output to the position circuit 107. The position circuit 107 (calculation unit) calculates the position of the mask substrate 101 by using the measured position information.

Then, the defect region image is sent to the low NA inspection circuit 146 with data indicating the position of the mask substrate 101 on the XYθ table 102 output from the position circuit 107. Measurement data (defect region image: pixel data) is 8-bit unsigned data, for example, and indicates a gray level (light intensity) of brightness of each pixel. The defect region image having been output to the low NA inspection circuit 146 is stored in the storage device 52. According to what is described above, data of an image (measured image) to be compared with the other for low NA inspection is generated.

Figure 9:
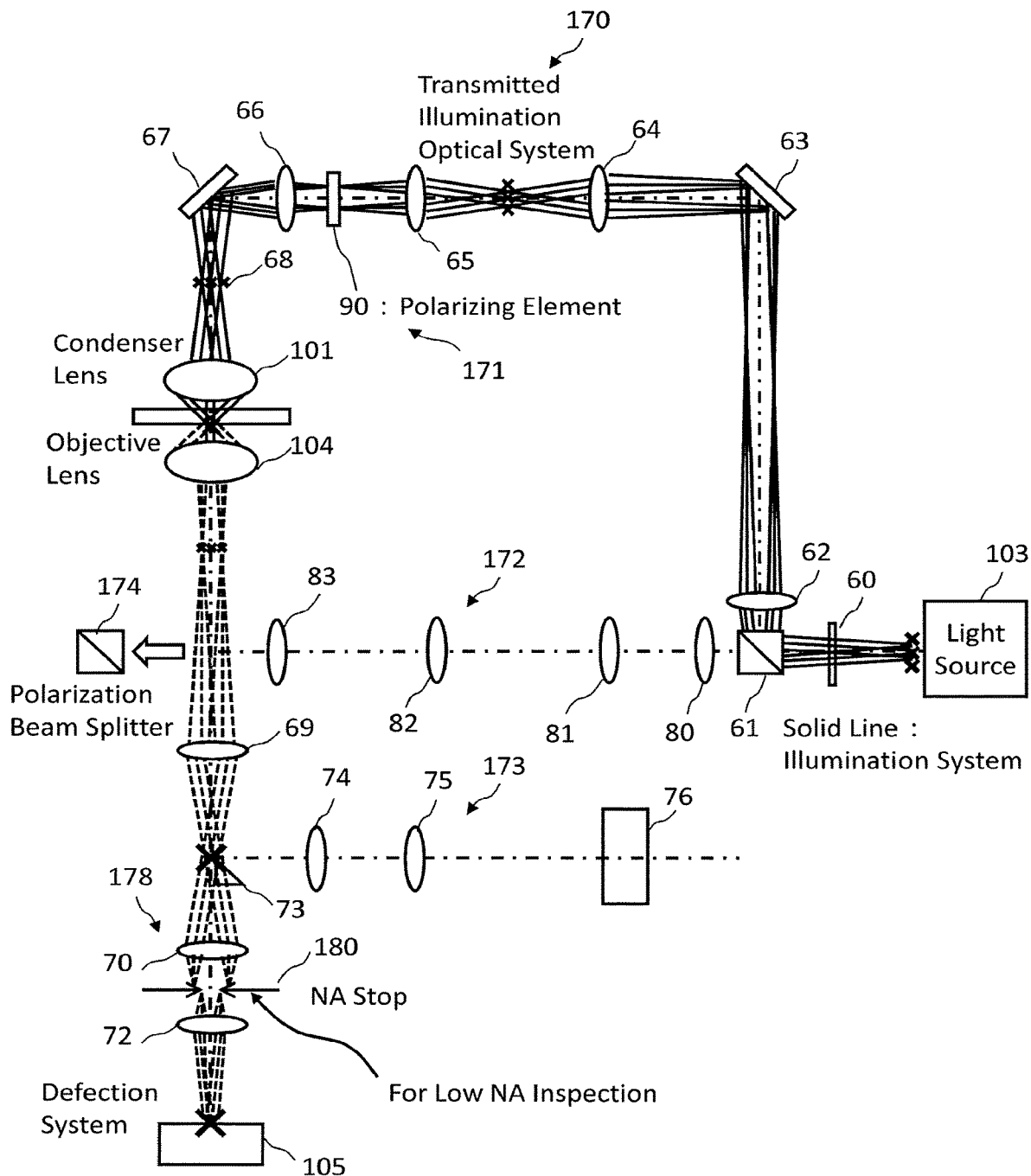
FIG. 9 shows an example of mechanism for changing the illumination shape according to the first embodiment.

FIG. 9 shows an example of mechanism for changing the illumination shape according to the first embodiment. In FIG. 9, the illumination shape changing mechanism 171 moves a polarizing element 90 between the lenses 65 and 66. By this, it becomes possible to change the structure of the transmitted illumination optical system 170, and therefore, the transmitted illumination optical system 170 can change the illumination shape. By making illumination light for transmission inspection pass through the polarizing element 90, the illumination shape of the illumination light for transmission inspection can be changed for polarization illumination whose polarization direction has been operated. By replacing the polarizing element 90 for a diffraction element, the illumination shape can be changed to be for N-pole illumination, such as 2-pole illumination or 4-pole illumination, or for annular illumination, etc. Although the polarizing element 90 is positioned between the lenses 65 and 66 in the example of FIG. 9, it is not limited thereto. What is necessary is to complete polarizing before the light reaches the mask substrate 101. Therefore, the polarizing element 90 should be positioned anywhere in the optical path from the polarizing plate 60 to the condenser lens 68.

Figure 10:
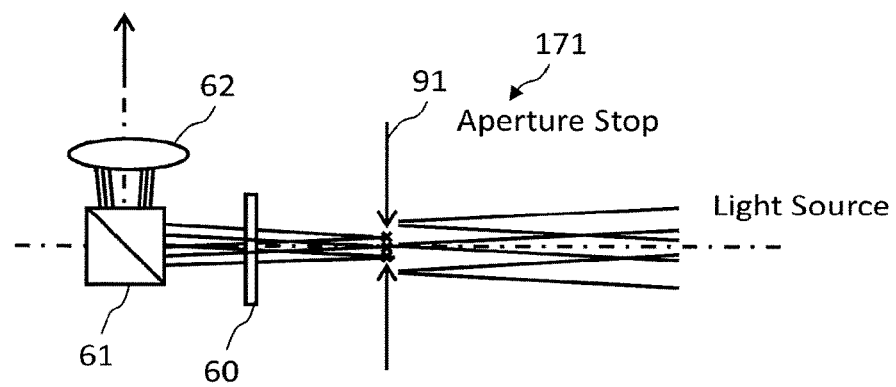
FIG. 10 shows another example of mechanism for changing the illumination shape according to the first embodiment.

FIG. 10 shows another example of mechanism for changing the illumination shape according to the first embodiment. In FIG. 10, the illumination shape changing mechanism 171 may move a diaphragm 91 to be located between the light source 103 and the polarizing plate 60. By this, it becomes possible to change the structure of the transmitted illumination optical system 170, and therefore, the transmitted illumination optical system 170 can change the illumination shape. Illumination shape can be changed for small sigma illumination by narrowing down the diaphragm 91. Although the diaphragm 91 is located between the light source 103 and the polarizing plate 60 in the example of FIG. 10, it is not limited thereto. What is necessary is to complete narrowing-down before the light reaches the mask substrate 101. Therefore, the diaphragm 91 should be positioned anywhere in the optical path from the polarizing plate 60 to the mask substrate 101.

Figure 11:
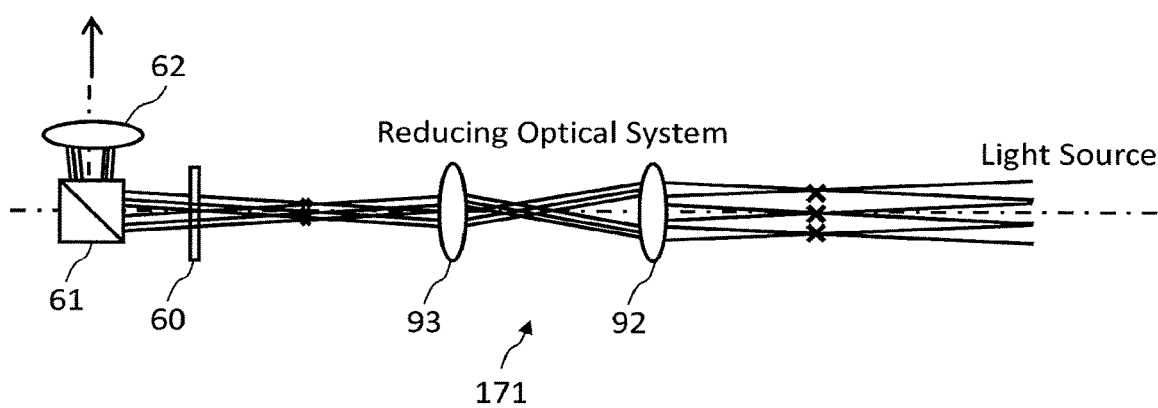
FIG. 11 shows another example of mechanism for changing the illumination shape according to the first embodiment.

FIG. 11 shows another example of mechanism for changing the illumination shape according to the first embodiment. In FIG. 11, the illumination shape changing mechanism 171 may arrange a reducing optical system by lenses 92 and 93 between the light source 103 and the polarizing plate 60. By this, it becomes possible to change the structure of the transmitted illumination optical system 170, and therefore, the transmitted illumination optical system 170 can change the illumination shape. Illumination shape can be changed for a light of different magnification by reducing light through the reducing optical system. Although the reducing optical system by the lenses 92 and 93 is located between the light source 103 and the polarizing plate 60 in the example of FIG. 11, it is not limited thereto. What is necessary is to complete reducing before the light reaches the mask substrate 101. Therefore, the reducing optical system by the lenses 92 and 93 should be arranged anywhere in the optical path from the polarizing plate 60 to the condenser lens 68.

Any one, any two, or all of the illumination shape changing mechanisms 171 shown in FIGS. 9, 10, and 11 may be combined and arranged. Necessary optical elements should be arranged in accordance with specifications of the exposure apparatus.

Since, in the low NA inspection mode, the polarization beam splitter 174 has been moved from inside to outside the optical path as described above, the light through the reflected illumination optical system 172 is not illuminated onto the mask substrate 101. Therefore, no reflected light from the mask substrate 101 is obtained. Thus, reflected light from the mask substrate 101 cannot be used for AF control. Accordingly, it is configured as described below.

In the AF control step (S122), the AF control circuit 140 (a part of a focusing mechanism) dynamically focuses a transmitted light, based on focus position information stored in the magnetic disk drive 109, while the photodiode array 105 receives transmitted lights corresponding to low numerical aperture during moving of the XYθ table 102, in the state where the polarization beam splitter 174 has been moved out of the optical path. Specifically, based on measured focus position information stored in the magnetic disk drive 109, the AF control circuit 140 dynamically adjusts the focus position (optical axis direction: Z axis direction) of the objective lens 104 to the pattern forming surface of the mask substrate 101 by following the advance of the XYθ table 102 by moving the objective lens 104 in the optical axis direction (Z axis direction) in real time by controlling the piezoelectric element 142 (a part of focusing mechanism).

In the simulation image input step (S124), the control computer 110 inputs, from the outside the inspection apparatus 100, a simulation image corresponding to a pattern image to be formed on the semiconductor substrate 304 in the case where a pattern is exposed and transferred to the semiconductor substrate 304 by the exposure apparatus, and stores it in the magnetic disk drive 109. It is preferable to generate a simulation image for each frame region 30, for example. Moreover, it is preferable beforehand to input simulation images with respect to the whole of the inspection region 10 of the mask substrate 101, and store them in the magnetic disk drive 109. Then, the control computer 110 reads a simulation image corresponding to a region having been specified that there is a defect therein from the magnetic disk drive 109, and transmits it to the low NA inspection circuit 146. The low NA inspection circuit 146 inputs the simulation image corresponding to the region having been specified that there is a defect therein, and stores it in the storage device 50.

In the comparison step (S126), the low NA inspection circuit 146 compares a simulation image and a transmitted light image of a pattern in the region having been specified that there is a defect therein, where the simulation image is based on the assumption that a pattern formed on the mask substrate 101 is to be transferred to the semiconductor substrate by the exposure apparatus and the transmitted light image was acquired as a result of receiving light corresponding to the low NA state by the photodiode array 105. Specifically, the position alignment unit 56 reads a frame image (transmitted light image of pattern in defect region: optical image) serving as a comparison target from the storage device 52. Moreover, the position alignment unit 56 reads a simulation image serving as a comparison target from the storage device 50. Then, the position alignment unit 56 performs a position alignment based on a predetermined algorithm between the frame image (transmitted light image of pattern in defect region: optical image) serving as a comparison target and the simulation image serving as a comparison target. The position alignment is performed using a least-squares method, for example. Then, the comparison unit 58 compares both the images according to predetermined determination conditions. For example, it is examined whether there is at least one of circuit disconnection and short circuiting in the defect region, by comparing the transmitted light image of a pattern in the defect region and the simulation image. Then, the comparison result is output, and specifically should be output to the magnetic disk drive 109, magnetic tape drive 115, flexible disk drive (FD) 116, CRT 117, or pattern monitor 118, or alternatively, output from the printer 119.

As described above, according to the first embodiment, in the inspection apparatus 100 which inspects minute defects of the mask substrate 101, it is possible to inspect an image to be formed in the case where a pattern on the mask substrate 101 is exposed and transferred to a semiconductor substrate, etc. by an exposure apparatus. Even when it is determined to be defective by high NA inspection, if neither circuit disconnection nor short-circuitry is detected in the defect region, the mask substrate 101 can be judged to be usable. Therefore, useless defect correction can be eliminated. Accordingly, the time required to manufacture semiconductor products can be reduced, for example.

In the above description, what is described as a "circuit" or "unit" includes a processing circuitry. As the processing circuitry, for example, an electric circuit, computer, processor, circuit board, quantum circuit, or semiconductor device may be used. Each "circuit" or each "unit" may use a common processing circuitry (same processing circuitry), or different processing circuitries (separate processing circuitries). When using a computer, a processor, and the like, programs are stored in a recording medium, such as a magnetic disk drive, magnetic tape drive, FD, or ROM (Read Only Memory). For example, each circuit in the position circuit 107, comparison circuit 108, development circuit 111, reference circuit 112, autoloader control circuit 113, table control circuit 114, AF control circuit 140, inspection mode switching control circuit 144, and low NA inspection circuit 146 may be configured by electric circuits. Alternatively, they may be implemented as software to be processed by the control computer 110, or a computer, etc. arranged in each circuit, or implemented by a combination of electric circuits and software. Similarly, functions such as the region specifying unit 51, position alignment unit 56, comparison unit 58, etc. may be configured by electric circuits. Alternatively, they may be processed by the control computer 110, or a computer, etc. arranged in each circuit.

Embodiments have been explained referring to specific examples described above. However, the present invention is not limited to these specific examples.

While the apparatus configuration, control method, and the like not directly necessary for explaining the present invention are not described, some or all of them can be selectively used on a case-by-case basis when needed. For example, although description of the configuration of the control unit for controlling the inspection apparatus 100 is omitted, it should be understood that some or all of the configuration of the control unit can be selected and used appropriately when necessary.

In addition, any other pattern inspection apparatus and pattern inspection method that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A pattern inspection apparatus comprising:
  a stage configured to mount a mask substrate with a pattern formed thereon and to be movable;
  a transmitted illumination optical system configured to illuminate the mask substrate with a first inspection light, and to be able to change an illumination shape of the first inspection light;
  a reflected illumination optical system configured to include an objective lens and a polarizing element, illuminate the mask substrate with a second inspection light by using the objective lens and the polarizing element, and let a reflected light from the mask substrate pass through the reflected illumination optical system;
  a drive mechanism configured to enable the polarizing element to be moved from outside to inside an optical path, and from the inside to the outside the optical path;
  a sensor configured to receive a transmitted light from the mask substrate illuminated with the first inspection light while the stage is moving;
  an image forming optical system configured to receive the transmitted light through the objective lens, and focus a received transmitted light to form an image on the sensor; and
  an aperture stop placed between the mask substrate and the sensor such that the first inspection light passes through the mask substrate, then through the aperture stop, and then onto the sensor, and configured to adjust a light flux diameter of the transmitted light so that the transmitted light reaching the sensor can be variably switched between a transmitted light corresponding to a state of high numerical aperture (NA) with which the transmitted light from the mask substrate can enter the objective lens and a transmitted light corresponding to a state of low numerical aperture with which the transmitted light from the mask substrate can enter the objective lens, wherein in a case of switching a numerical aperture to the state of the low numerical aperture, the polarizing element is moved from the optical path of the transmitted light from the mask substrate between the mask substrate and the sensor to an outside of the optical path.

2. The apparatus according to claim 1, further comprising:
a storage device configured to store focus position information of each position on the mask substrate, which was measured using a reflected light from the mask substrate illuminated with the second inspection light, in a state where the polarizing element has been moved into the optical path; and
a focusing mechanism configured to dynamically focus the transmitted light, based on the focus position information stored in the storage device, while the sensor receives the transmitted light corresponding to the low numerical aperture during moving of the stage, in a state where the polarizing element has been moved out of the optical path.

3. The apparatus according to claim 1, wherein the aperture stop is placed in an optical path of the image forming optical system.

4. The apparatus according to claim 3, wherein, by narrowing a light flux diameter of the transmitted light passing through the optical path of the image forming optical system, a light flux of the transmitted light, corresponding to the state of low numerical aperture of numerical aperture (NA) in the transmitted light from the mask substrate which enters the objective lens, is made to reach the sensor.

5. The apparatus according to claim 1, wherein in a case of narrowing the light flux diameter of the transmitted light by the aperture stop, the drive mechanism moves the polarizing element from inside to outside the optical path.

6. The apparatus according to claim 1, wherein in a case of expanding the light flux diameter of the transmitted light by the aperture stop, the drive mechanism moves the polarizing element from outside to inside the optical path.

7. A pattern inspection method comprising:
capturing one of a transmitted light image and a reflected light image of a pattern formed on a mask substrate by scanning the mask substrate by using a sensor in a state where the sensor can receive one of a transmitted light and a reflected light in a state of high numerical aperture of numerical aperture (NA) with which light from the mask substrate can enter an objective lens that magnifies one of the transmitted light and reflected light from the mask substrate with the pattern formed thereon;

inspecting a defect of the pattern by using an optical image of one of a captured transmitted light image and a captured reflected light image of the pattern on the mask substrate;
specifying a region where a defect has been detected as a result of the inspecting;
switching the numerical aperture from the state of high numerical aperture to a state of low numerical aperture by an aperture stop placed between the mask substrate and the sensor after the inspecting, such that the first inspection light passes through the mask substrate, then through the aperture stop, and then onto the sensor, and moving a polarizing element from an optical path of the transmitted light from the mask substrate between the mask substrate and the sensor to an outside of the optical path,
capturing a transmitted light image of the pattern formed on the mask substrate by using the sensor by scanning the region of the mask substrate, which was specified using a predetermined illumination light, in a state where the sensor can receive light corresponding to the state of low numerical aperture, and where the polarizing element is located in the optical path between the mask substrate and the sensor; and
comparing a simulation image and the transmitted light image of the pattern in the region, which was acquired as a result of receiving light corresponding to the state of low numerical aperture by the sensor, where the simulation image is based on an assumption that the pattern formed on the mask substrate is to be transferred to a semiconductor substrate by an exposure apparatus.

8. The method according to claim 7, wherein
the sensor receives a transmitted light, from the mask substrate, corresponding to the state of low numerical aperture by scanning the region of the mask substrate, which was specified using the predetermined illumination light,
a focus position of each position on the mask substrate is measured using the reflected light when the sensor receives the reflected light in the state of high numerical aperture, and
the transmitted light is dynamically focused, based on measured focus position information, when the sensor receives the transmitted light, from the mask substrate, corresponding to the state of low numerical aperture.

9. The method according to claim 8, wherein at least one of circuit disconnection and short circuiting is examined by comparing the transmitted light image of the pattern in the region and the simulation image.

10. The method according to claim 8, wherein a light flux diameter of the transmitted light is adjusted using an aperture stop placed between the mask substrate and the sensor when the numerical aperture is changed.

* * * * *